(12) United States Patent
Tukker et al.

(10) Patent No.: US 10,180,630 B2
(45) Date of Patent: Jan. 15, 2019

(54) ILLUMINATION SYSTEM FOR A LITHOGRAPHIC OR INSPECTION APPARATUS

(71) Applicant: ASML Netherlands B.V., Veldhoven (NL)

(72) Inventors: Teunis Willem Tukker, Eindhoven (NL); Nitesh Pandey, Eindhoven (NL); Coen Adrianus Verschuren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/639,467

(22) Filed: Jun. 30, 2017

(65) Prior Publication Data

US 2018/0004095 A1    Jan. 4, 2018

(30) Foreign Application Priority Data

Jul. 1, 2016    (EP) ..................................... 16177433

(51) Int. Cl.
*G03F 7/20*    (2006.01)
*F21V 9/30*    (2018.01)
(Continued)

(52) U.S. Cl.
CPC ............ *G03F 7/70191* (2013.01); *F21V 9/30* (2018.02); *F21V 14/08* (2013.01); *G03F 7/7005* (2013.01);
(Continued)

(58) Field of Classification Search
CPC .............. G03F 7/70633; G03F 7/7065; G03F 7/70483; G03F 7/7005; G03F 9/7065;
(Continued)

(56) References Cited

U.S. PATENT DOCUMENTS

2006/0033423 A1* 2/2006 Nishimura ............. G09F 13/20
                                                        313/501
2006/0033921 A1    2/2006 Den Boef
(Continued)

FOREIGN PATENT DOCUMENTS

WO    WO 03/016781 A2    2/2003
WO    WO 2005/057670 A2    6/2005
WO    WO 2013/026750 A1    2/2013

OTHER PUBLICATIONS

Extended European Search Report directed to European Patent Application No. 16177433.6, dated Jan. 27, 2017; 6 pages.
(Continued)

*Primary Examiner* — Steven Whitesell Gordon
(74) *Attorney, Agent, or Firm* — Sterne, Kessler, Goldstein & Fox P.L.L.C.

(57) ABSTRACT

An illumination system has a microLED array 502. The microLED array 502 is imaged or placed very close to a phosphor coated glass disc 504 which upconverts the light from the microLED array into a narrow band emission. The plate has at least two different photoluminescent materials arranged to be illuminated by the microLED array and to thereby emit output light. The different photoluminescent materials have different emission spectral properties of the output light, e.g. different center wavelength and optionally different bandwidth. Illumination of different photoluminescent materials by the illumination sources is selectable, by selective activation of the microLEDs or by movement of the photoluminescent materials relative to the illumination sources, to provide different illumination of the different photoluminescent materials. This provides tunable spectral properties of the output light. Selectively configurable filters
(Continued)

506 are arranged to filter the output light in accordance with the selected illumination of the different photoluminescent materials.

20 Claims, 5 Drawing Sheets

(51) Int. Cl.
    *F21V 14/08*     (2006.01)
    *F21Y 115/10*     (2016.01)

(52) U.S. Cl.
    CPC ...... *G03F 7/70575* (2013.01); *G03F 7/70625* (2013.01); *G03F 7/70633* (2013.01); *F21Y 2115/10* (2016.08)

(58) Field of Classification Search
    CPC ............. G01N 21/956; G01N 21/4788; G01N 21/9501; G01N 21/47; G01J 3/4412
    See application file for complete search history.

(56) References Cited

U.S. PATENT DOCUMENTS

| | | | |
|---|---|---|---|
| 2006/0066855 | A1 | 3/2006 | Boef et al. |
| 2008/0303407 | A1* | 12/2008 | Brunner ............. C09K 11/0883 313/496 |
| 2009/0002604 | A1 | 1/2009 | Morimoto |
| 2010/0201963 | A1 | 8/2010 | Cramer et al. |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0102753 | A1 | 5/2011 | Van De Kerkhof et al. |
| 2012/0044470 | A1 | 2/2012 | Smilde et al. |
| 2012/0123581 | A1 | 5/2012 | Smilde et al. |
| 2012/0170014 | A1 | 7/2012 | Odom et al. |
| 2012/0242912 | A1* | 9/2012 | Kitano ................. H04N 9/3111 348/759 |
| 2013/0258310 | A1 | 10/2013 | Smilde et al. |
| 2013/0271740 | A1 | 10/2013 | Quintanilha |
| 2013/0328172 | A1* | 12/2013 | Tischler .................. H01L 21/78 257/620 |
| 2014/0192338 | A1 | 7/2014 | Den Boef |
| 2015/0131062 | A1* | 5/2015 | Nishimori .............. G03B 21/16 353/84 |

OTHER PUBLICATIONS

Webpage titled, "Laser Phosphor Display," Prysm, retrieved Aug. 14, 2017 from https://www.prysm.com/platform/displays/laser-phosphor-display/.

International Search Report and Written Opinion of the International Searching Authority directed to related International Application No. PCT/EP2017/064670, dated Nov. 16, 2017; 10 pages.

* cited by examiner

ILLUMINATION SYSTEM FOR A LITHOGRAPHIC OR INSPECTION APPARATUS

BACKGROUND

Field of the Invention

The present invention relates to an illumination system for a lithographic or inspection apparatus usable, for example, in the manufacture of devices by lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications US2014192338 and US2011069292A1 which documents are hereby incorporated by reference in their entirety. Further developments of the technique have been described in published patent publications US20110027704A, US20110043791A, US2011102753A1, US20120044470A, US20120123581A, US20130258310A and US20130271740A. These targets can be smaller than the illumination spot and may be surrounded by product structures on a wafer. Multiple gratings can be measured in one image, using a composite grating target. The contents of all these applications are also incorporated herein by reference.

Both lithography and scatterometry apparatuses require an illumination system.

In particular, scatterometry often requires a number of different illumination wavelengths.

Typically, broad bandwidth laser pumped Xe plasma sources are used as scatterometer illumination sources. The efficiency of the such sources is low as the complete spectrum of light (400-900 nm) is generated while only a small bandwidth of 10 to 30 nm is used. In other words only 6% of the light may be used.

Furthermore, scatterometry often requires a number of different illumination pupil profiles. Different illumination pupil profiles have different intensity in different regions across the illumination pupil plane.

Diffraction-based overlay metrology using dark-field imaging of the diffraction orders is a key aspect of advanced process correction loops for semiconductor metrology. In order to keep up with the reducing on-product overlay requirement in the future (for example ~2 nm), overlay metrology accuracy and repeatability has to improve. In scatterometers, the overlay is measured using markers as small as 10 um (X and Y combined) and is measured in a single shot using a high—NA (Numerical Aperture) (NA=0.95) cross aperture mode. It is well known that different targets with different pitches and thin film layers have different optimum illumination pupil profiles. An optimized illumination pupil profile increases stack sensitivity and decreases stray light induced measurement errors. Such a flexible pupil profile also has benefits for 3D-NAND applications.

The required illumination pupil profiles for these illumination modes are usually obtained by the placing of a suitable aperture plate between the source and the target being measured. However, there can be many different illumination modes needed each requiring a different aperture plate. This ultimately puts a practical limit on the number of modes available. Additional flexibility can be obtained by using a Spatial Light Modulator (SLM). However, both aperture plates and SLMs reduce the amount of light available by ultimately blocking a portion of the light from the source.

Conventional illumination systems that provide different wavelengths and/or flexible illumination profiles are expensive, are not compact and are complex, and therefore unreliable.

SUMMARY

The inventors have devised an illumination source that works as a wavelength tunable light source and may provide a flexible illumination pupil profile, while avoiding or at least mitigating one or more of the associated problems mentioned above. The illumination source is suitable for a lithographic or inspection apparatus.

In the present disclosure and claims, different photoluminescent materials are described as having different emission spectral properties. This means that the emission has different spectral content or shape (flux versus wavelength). This is typically parametrized by the wavelength and bandwidth.

The invention in a first aspect provides an illumination system for a lithographic or inspection apparatus, the system comprising:

a plurality of illumination sources;

at least two different photoluminescent materials arranged to be illuminated by the plurality of illumination sources and to thereby emit output electromagnetic radiation, wherein the different photoluminescent materials have different emission spectral properties of the output electromagnetic radiation and wherein illumination of different photoluminescent materials by the illumination sources is selectable to provide different illumination of the different photoluminescent materials, so as to provide tunable spectral properties of the output electromagnetic radiation; and a plurality of selectively configurable filters arrangeable to filter the output electromagnetic radiation in accordance with the selected illumination of the different photoluminescent materials.

The invention in a second aspect provides an illumination system for a lithographic or inspection apparatus, the system comprising:

a microLED array;

at least two different phosphors arranged to be illuminated by the microLED array and to thereby emit output light, wherein the different phosphors have different emission spectral properties of the output light and wherein illumination of different phosphors by the microLED array is selectable by selective activation of the microLED array and/or movement of the phosphors relative to the microLED array to provide different illumination of the different photoluminescent materials, so as to provide tunable spectral properties of the output light; and one or more filter wheel configurable to filter the output light in accordance with the selected illumination of the different phosphors.

The invention further provides an inspection apparatus comprising the illumination system of the first or second aspect.

The invention further provides a lithographic apparatus comprising the illumination system of the first or second aspect.

BRIEF DESCRIPTION OF THE DRAWINGS/FIGURES

Embodiments of the invention will now be described, by way of example, with reference to the accompanying drawings in which.

Figure 3A:
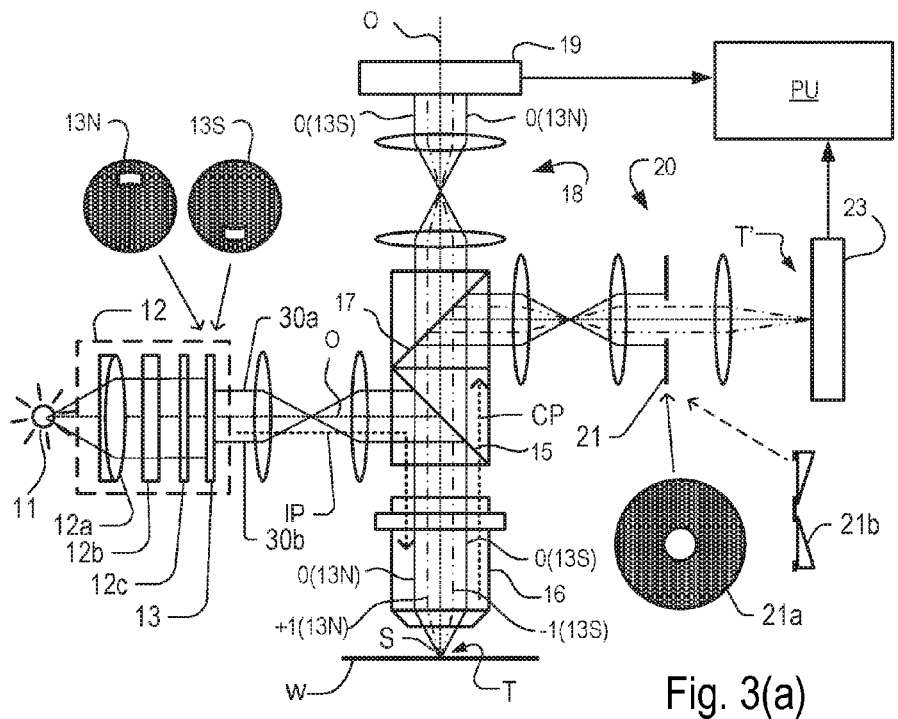
Figure 3B:
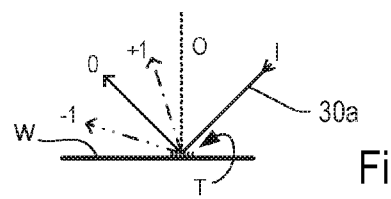
Figure 4:
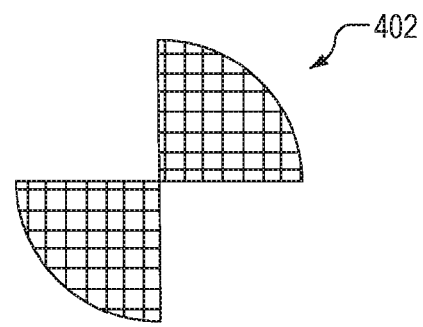
Figure 5:
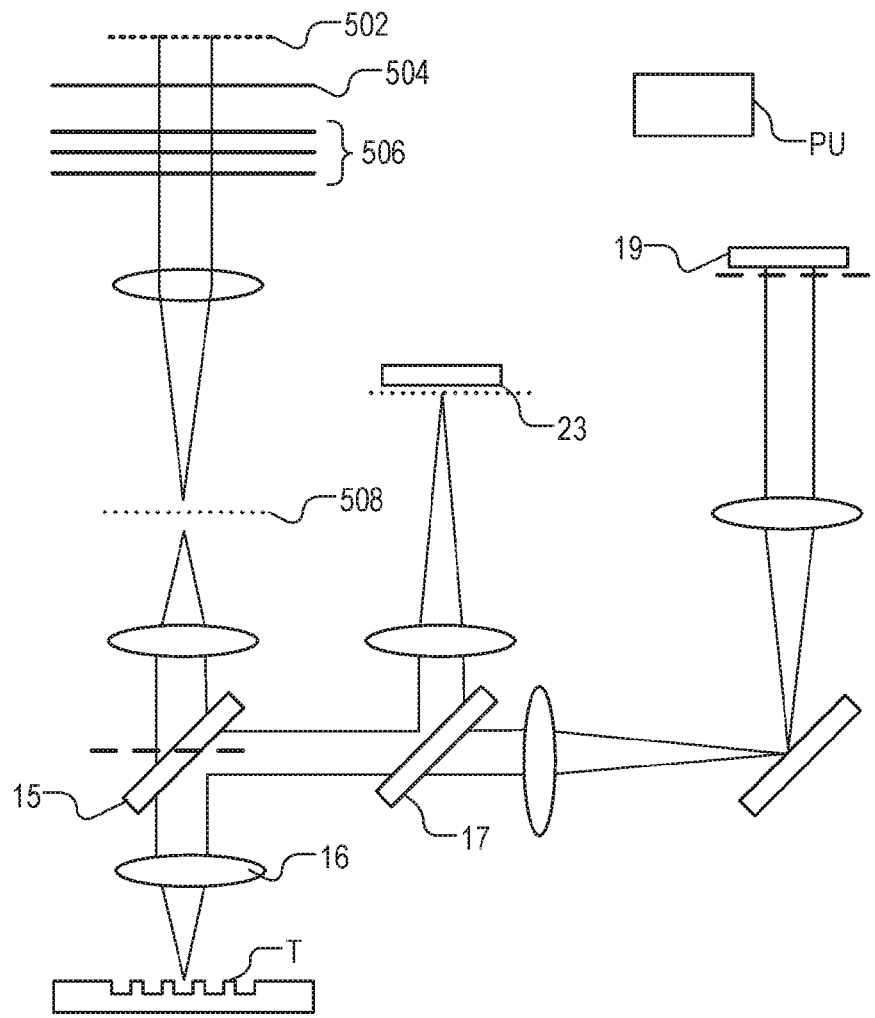
Figure 6A:
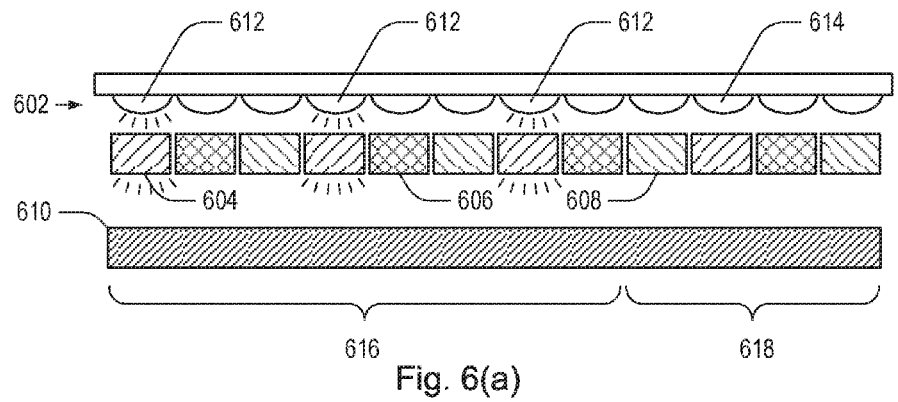
Figure 6B:
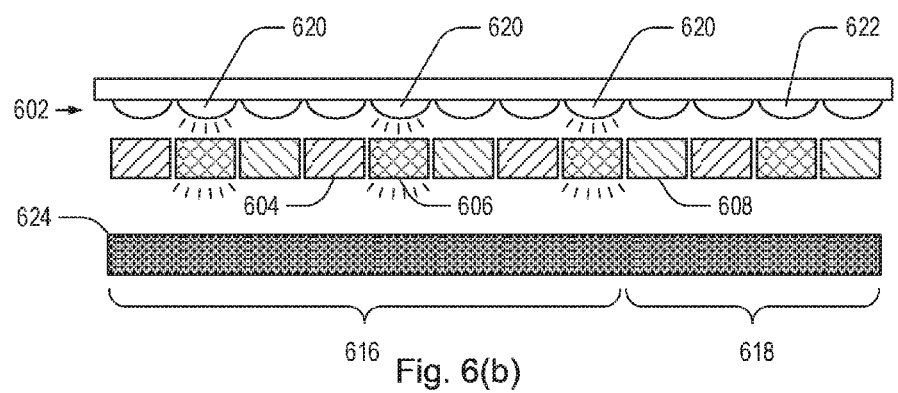
Figure 6C:
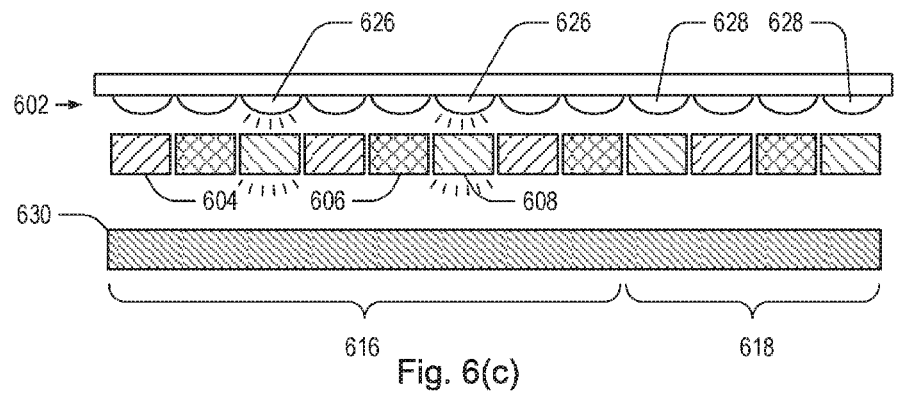
Figure 7A:
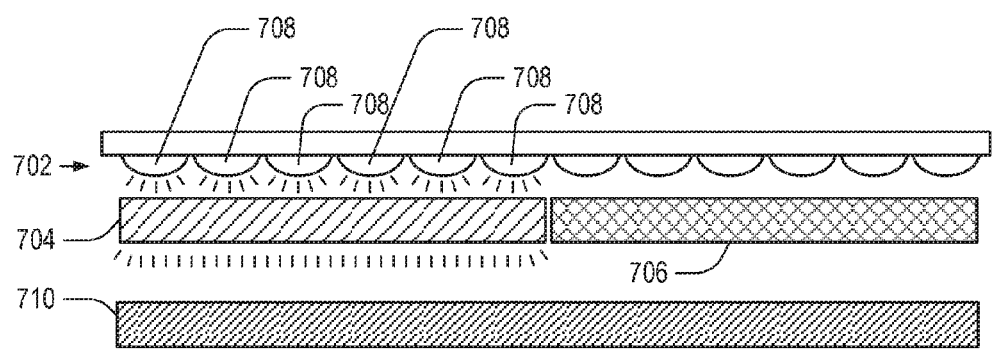
Figure 7B:
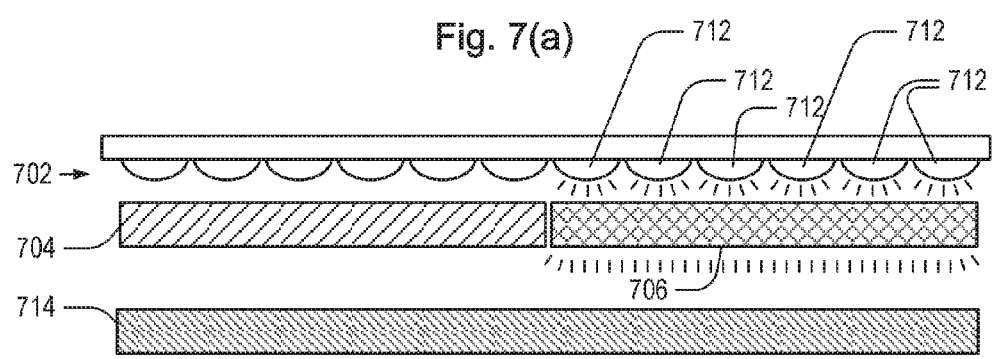
Figure 8:
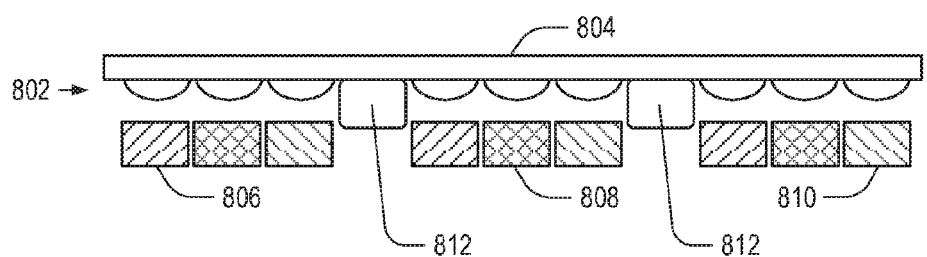

FIGS. 3(a) and 3(b) illustrate schematically an inspection apparatus adapted to perform known dark-field imaging inspection methods;

FIG. 4 illustrates schematically a microLED array;

FIG. 5 illustrates a scatterometer comprising an illumination system in accordance with an embodiment of the invention;

FIGS. 6(a), 6(b) and 6(c) illustrate an illumination system in accordance with an embodiment of the invention;

FIGS. 7(a) and 7(b) illustrate an illumination system in accordance with another embodiment of the invention; and FIG. 8 illustrates an illumination system having cooling channels in accordance with another embodiment of the invention.

DETAILED DESCRIPTION

Before describing embodiments of the invention in detail, it is instructive to present an example environment in which embodiments of the present invention may be implemented.

Figure 1:
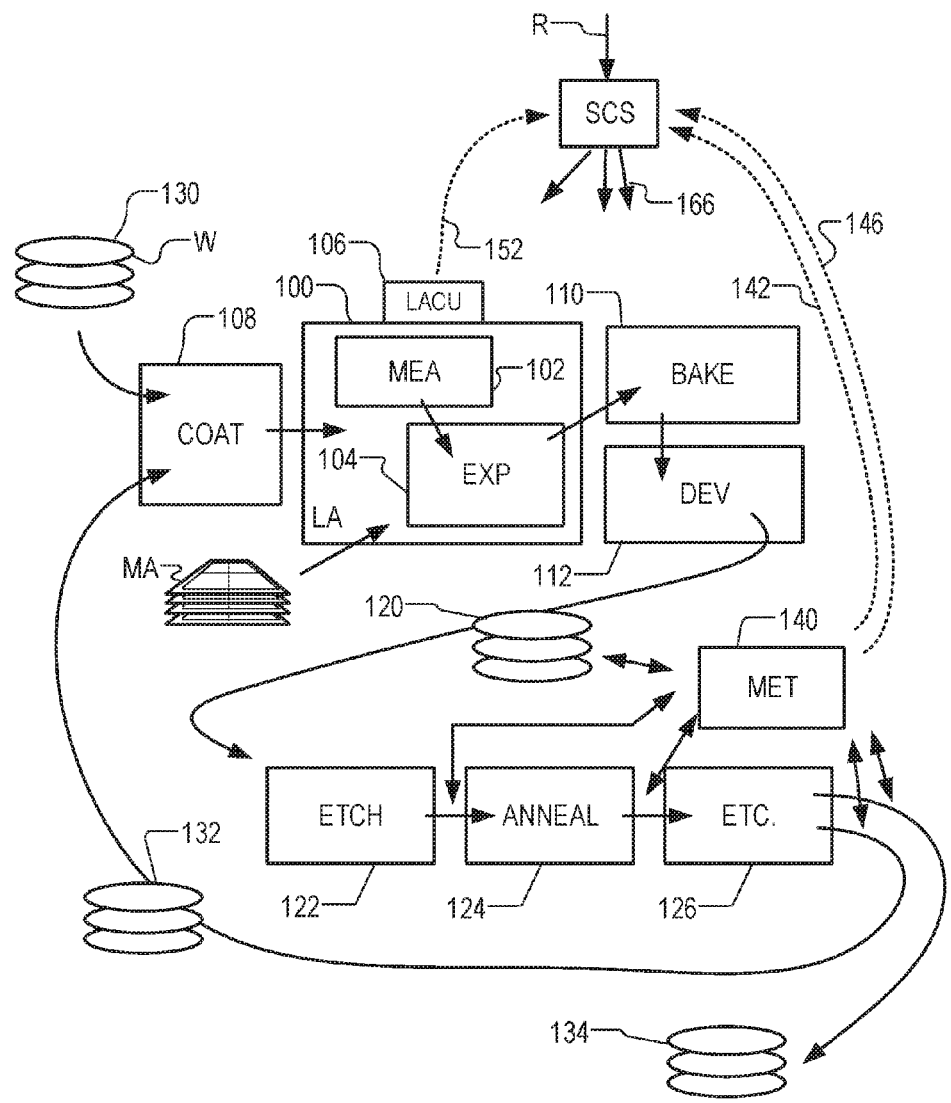
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Figure 2:
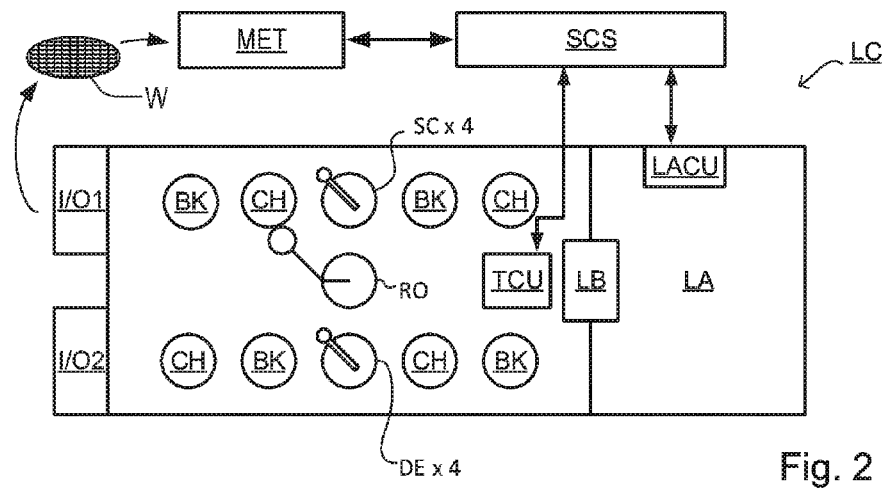
FIG. 2 depicts a lithographic cell or cluster in which an illumination source according to an embodiment of the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-filed-imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain numerical apertures over 1 if desired. Further increases in NA can be obtained by use of solid immersion lens (SIL) techniques, including micro-SIL and equivalents.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30a, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

The remaining figures illustrate example illumination systems. In these examples, a microLED array is used as the illumination sources. In the first example, it is used in combination with phosphor plates to realize the wavelength-tunable source and flexible pupil profile at the same time.

With respect to FIG. 4, a microLED (Light Emitting Diode) array 402 with 405 nm blue LEDs is used as the illumination sources. Each LED is of the size of around 20 um and the light output can be individually controlled. These numbers are typical examples and are not limiting. The desired pupil illumination profile is set on the LED array by selective activation of the LEDs in order to define an output electromagnetic radiation profile.

Such LED arrays are defined by lithography steps, and have a large design freedom in dimension and layout. For example, the array does not need to be rectangular, but may be circular. In this example, it is the shape of two opposing quadrants. Also, different LED diameters can be used (for example from ~1 μm upwards) at different locations, and their spacing can be varied as needed. Practical limits of minimum pitch (center-to-center) spacing are determined by (micro-bump) bonding technology, currently around 20 μm.

The total size of the LED array may correspond to the required pupil size, which is, for example, 3.8 mm diameter. In case of (de)magnifying optics, this dimension can be larger or smaller.

MicroLED arrays are commercially available. A standard single microLED pixel is typically 20 μm in diameter. Devices can be fabricated in a cluster of single pixels creating collimated emitters up to 1 mm in diameter—or as arrays of individually addressable emitters. According to the state of the art, a single pixel can generate up to 1 mW, which results in a light intensity of more than 300 W/cm$^2$. Higher power can be achieved by using clusters of emitters. High powers may be accompanied with active cooling in close proximity to the emission region in order to maintain performance and lifetime of the devices.

FIG. 5 illustrates a scatterometer comprising an illumination system.

The illumination system has a plurality of illumination sources, in this example a microLED array 502.

The microLED array 502 is imaged or placed very close to a phosphor coated glass disc 504 which upconverts the light from the microLED array into a narrow band emission. The photoluminescent materials may be moveable relative to the illumination sources by rotation of the disc. Instead of a glass plate coated with a layer of phosphor, the phosphor ceramic material can also be made directly into a freestanding plate without a separate carrier substrate (as is used in some LED lighting applications).

The plate has at least two different photoluminescent materials arranged to be illuminated by the microLED array and to thereby emit output electromagnetic radiation, referred to here as output light. The different photoluminescent materials have different emission spectral properties of the output light, e.g. different center wavelength and optionally different bandwidth.

Illumination of different photoluminescent materials by the microLED array is selectable by movement of the photoluminescent materials relative to the microLED array. In this example, the photoluminescent materials are moveable by one or more rotating disc A controller PU is configured to select the spectral properties of the output electromagnetic radiation by controlling the movement of the one or more rotating disc.

One example of a well-characterized ceramic phosphor is Ce-doped YAG, much used in LED lighting applications. This phosphor has a broad spectrum in the visible range, and is typically made to a thickness/density to tune its transparency for 405 nm light to match the converted light to result in white light. Its thickness is tuned such that the transmission and absorption and subsequent conversion in longer wavelengths result in white light.

In an alternative embodiment, a range of narrow-band emitting phosphors (~30 nm each) is used, at different center wavelengths together covering the visible spectrum. Depending on the required wavelength, the appropriate phosphor plate is mechanically selected. Any residual 405 nm light can be filtered away after the phosphor either using the filter wheel or an additional dichroic mirror. An advantage of this embodiment is an increased light efficiency (less photons to be filtered out) at the limited expense of an additional phosphor plate selection mechanics.

The type of phosphor in the glass plate can be optimized such that the emitted light is maximally in the required wavelength range. This can be done by using different phosphor sheets on a rotating wheel or sliding configuration.

In terms of radiance, in a conventional scatterometer illumination source, the radiance provided at the illuminating pupil is 50 mW/mm$^2$/nm/sr. Ceramic phosphors can have a radiance distribution in the range of 3-5 W/mm$^2$/Sr. Thus the radiance requirements can be met by the present disclosure.

A plurality of selectively configurable filters 506 are arranged to filter the output electromagnetic radiation in accordance with the selected illumination of the different photoluminescent materials. In this example, a set of tunable-wavelength filter wheels 506 are used to further tune the desired wavelength of the output light to be used for the scatterometer measurement.

The spot size is selected after the pupil plane selection. A spot size selector is placed in the image plane 508. The ovals in the scatterometer illustrated in FIG. 5 represent lenses. The light paths are represented as parallel, converging and diverging lines. Dotted lines at 508 and beside image sensor 23 represent the image plane. Dashed lines at beam splitter 15 and beside pupil sensor 19 represent the pupil plane. The remaining features in the scatterometer shown in FIG. 5 are labelled with the same reference numbers as in FIG. 3(a).

Illumination of different regions of the photoluminescent materials by the illumination sources may be selectable, by selective activation of the microLEDs, so as to define an output light profile having different intensity in different regions of the illumination pupil plane, as described with respect to FIG. 4.

FIGS. 6(a), 6(b) and 6(c) illustrate an illumination system.

With reference to FIG. 6(a), a plurality of illumination sources 602, such as a microLED array, are provided. First, second and third different photoluminescent materials 604, 606, 608 are provided. So as not to clutter the drawing, not all photoluminescent materials are labelled numerically. The three different photoluminescent materials 604, 606, 608 are illustrated by right-sloping diagonal hatching, cross hatching and left-sloping diagonal hatching respectively. The different photoluminescent materials 604, 606, 608 are arranged to be illuminated by the plurality of microLEDs 602 and to thereby emit output electromagnetic radiation. The different photoluminescent materials 604, 606, 608 have different emission spectral properties of the output electromagnetic radiation, e.g. different center wavelength and optionally different bandwidth.

The illumination of different photoluminescent materials 604, 606, 608 by the microLEDs 602 is selectable, by selective activation of the microLEDs 602, to provide different illumination of the first photoluminescent material 604 compared to the different photoluminescent materials 606 and 608. This provides spectral properties of the output electromagnetic radiation that are tuned in accordance with the emission spectral properties of the illuminated first photoluminescent material 604.

In FIG. 6(a), only some of the microLEDs 612, which are arranged to illuminate the first photoluminescent material 604, are activated. Other microLEDs, in this example 614, which are also arranged to illuminate the first photoluminescent material 604, are not illuminated. In this way, illumination of different regions of the first photoluminescent material 604 by the microLEDs is selectable, by selective activation of the microLEDs. This defines an output electromagnetic radiation profile having different intensity in a first region 616 of an illumination pupil plane, compared to a second region 618.

A selectively configurable filter 610 is arranged to filter the output electromagnetic radiation in accordance with the selected illumination of the first photoluminescent material 604.

FIG. 6(b) shows the same illumination system as FIG. 6(a), but with different activation of the microLEDs and a different filter selected.

The illumination of different photoluminescent materials 604, 606, 608 by the microLEDs 602 is selectable, by selective activation of the microLEDs 620, to provide different illumination of the second photoluminescent material 606 compared to the different photoluminescent materials 604 and 608. This provides spectral properties of the output electromagnetic radiation that are tuned in accordance with the emission spectral properties of the illuminated second photoluminescent material 606.

In FIG. 6(b), only some of the microLEDs 620, which are arranged to illuminate the second photoluminescent material 606, are activated. Other microLEDs, in this example 622, which are also arranged to illuminate the second photoluminescent material 606, are not activated. In this way, illumination of different regions of the second photoluminescent material 606 by the microLEDs is selectable, by selective activation of the microLEDs. Again, this defines an output electromagnetic radiation profile having different intensity in the first region 616 of the illumination pupil plane, compared to the second region 618.

A selectively configurable filter 624 is arranged to filter the output electromagnetic radiation in accordance with the selected illumination of the second photoluminescent material 606. The filter 624 may be on a different or the same filter wheel as the first filter 610, shown in FIG. 6(a).

FIG. 6(c) shows the same illumination system as FIGS. 6(a) and 6(b), but with different activation of the microLEDs and a different filter selected.

The illumination of different photoluminescent materials 604, 606, 608 by the microLEDs 602 is selectable, by selective activation of the microLEDs 626, to provide different illumination of the third photoluminescent material 608 compared to the different photoluminescent materials 604 and 606. This provides spectral properties of the output electromagnetic radiation that are tuned in accordance with the emission spectral properties of the illuminated third photoluminescent material 608.

In FIG. 6(c), only some of the microLEDs 626, which are arranged to illuminate the third photoluminescent material 608, are activated. Other microLEDs, in this example 628, which are also arranged to illuminate the third photoluminescent material 608, are not illuminated. In this way, illumination of different regions of the third photoluminescent material 608 by the microLEDs is selectable, by selective activation of the microLEDs. Again, this defines an output electromagnetic radiation profile having different intensity in the first region 616 of the illumination pupil plane, compared to the second region 618.

A selectively configurable filter 630 is arranged to filter the output electromagnetic radiation in accordance with the selected illumination of the third photoluminescent material 608. The filter 630 may be on a different or the same filter wheel as the first filter 610, shown in FIG. 6(a) and/or the second filter 624, shown in FIG. 6(b).

The operation described with reference to FIGS. 6(a), 6(b) and 6(c), may be controlled by a controller, such as PU in FIG. 5. The controller is configured to select the spectral properties of the output electromagnetic radiation by controlling activation of the illumination sources 602. The controller may be configured to define the output electromagnetic radiation profile by controlling activation of the illumination sources.

FIGS. 7(a) and 7(b) illustrate an illumination system.

With reference to FIG. 7(a), a plurality of illumination sources 702, such as a microLED array, are provided. First and second different photoluminescent materials 704 and 706 are provided. The different photoluminescent materials 704 and 706 are arranged to be illuminated by the plurality of microLEDs 702 and to thereby emit output electromagnetic radiation. The different photoluminescent materials 704 and 706 have different emission spectral properties of the output electromagnetic radiation, e.g. different center wavelength and optionally different bandwidth.

The illumination of different photoluminescent materials 704 and 706 by the microLEDs 702 is selectable, by selective activation of the microLEDs 708, to provide different illumination of the first photoluminescent material 704, compared to the different photoluminescent material 706. This provides spectral properties of the output electromagnetic radiation that are tuned in accordance with the emission spectral properties of the illuminated first photoluminescent material 704.

A selectively configurable filter 710 is arranged to filter the output electromagnetic radiation in accordance with the selected illumination of the first photoluminescent material 704.

FIG. 7(b) shows the same illumination system as FIG. 7(a), but with different activation of the microLEDs and a different filter selected.

The illumination of different photoluminescent materials 704 and 706 by the microLEDs 702 is selectable, by selective activation of the microLEDs 712, to provide different illumination of the second photoluminescent material 706, compared to the different photoluminescent material 704. This provides spectral properties of the output electromagnetic radiation that are tuned in accordance with the emission spectral properties of the illuminated second photoluminescent material 706.

A selectively configurable filter 714 is arranged to filter the output electromagnetic radiation in accordance with the selected illumination of the second photoluminescent material 706. The filter 714 may be on a different or the same filter wheel as the first filter 710, shown in FIG. 7(a).

FIG. 8 illustrates an illumination system with cooling channels.

With reference to FIG. 8, a plurality of illumination sources 802, such as a microLED array, are provided on a substrate 804. Different photoluminescent materials 806, 808, 810 are provided. The different photoluminescent materials 806, 808, 810 are arranged to be illuminated by the plurality of microLEDs 702 and to thereby emit output electromagnetic radiation. The different photoluminescent materials 806, 808, 810 have different emission spectral properties of the output electromagnetic radiation, e.g. different center wavelength and optionally different bandwidth. The operation of the illumination system is as described with reference to FIGS. 6(a) to 6(c).

One or more cooling channels 812 are in thermal communication with the plurality of illumination sources and different photoluminescent materials. The cooling channels 812 are provided on the substrate to convey cooling fluid, such as a liquid or gas, to remove excess heat generated by the LEDs and photoluminescent materials.

In conclusion, the present disclosure provides a tunable-wavelength illumination pupil with control over the pupil profile. It is a compact illumination system with low cost and high reliability.

Embodiments of the present disclosure allow the pupil profile distribution to be set per pixel. It is an advantage that the illumination source and pupil illumination profile-setting function are in the same module.

The illumination system has a much lower cost and improved stability when compared to a conventional light source and flexible illuminator.

The illumination system has a much higher contrast between dark and bright illumination states as some of the illumination sources can be completely switched off while the illumination system is still in operation.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An illumination system for a lithographic or inspection apparatus, the system comprising:
   a plurality of illumination sources;
   at least two different photoluminescent materials arranged to be illuminated by the plurality of illumination sources and to thereby emit output electromagnetic radiation, wherein the different photoluminescent materials have different emission spectral properties of the output electromagnetic radiation, and wherein the illumination of the different photoluminescent materials is selectable by selective activation of the illumination sources to provide different illumination of the different photoluminescent materials, so as to provide tunable spectral properties of the output electromagnetic radiation; and
   a plurality of selectively configurable filters arranged to filter the output electromagnetic radiation in accordance with the selected illumination of the different photoluminescent materials.

2. The illumination system of claim 1, further comprising a controller configured to select the spectral properties of the output electromagnetic radiation by controlling the selective activation of the illumination sources.

3. The illumination system of claim 1, wherein the illumination of the different photoluminescent materials by the illumination sources is further selectable by movement of the different photoluminescent materials relative to the illumination sources.

4. The illumination system of claim 3, further comprising a controller configured to select the spectral properties of the output electromagnetic radiation by controlling the movement of the different photoluminescent materials.

5. The illumination system of claim 3, wherein the different photoluminescent materials are moveable by one or more rotating discs.

6. The illumination system of claim 1, wherein the selective activation of the illumination sources is configured to illuminate different regions of the different photoluminescent materials, so as to define an output electromagnetic radiation profile having different intensity in different regions of an illumination pupil plane.

7. The illumination system claim 6, further comprising a controller configured to define the output electromagnetic radiation profile by controlling the selective activation of the illumination sources.

8. The illumination system of claim 1, further comprising one or more cooling channels in thermal communication with the plurality of illumination sources and the different photoluminescent materials.

9. The illumination system of claim 8, wherein the one or more cooling channels are configured to convey cooling fluid.

10. The illumination system of claim 1, wherein the selectively configurable filters are on one or more rotating wheels.

11. The illumination system of claim 1, further comprising a dichroic mirror configured to filter the output electromagnetic radiation.

12. The illumination system of claim 1, wherein the lithographic or inspection apparatus further comprises a spot size selector configured to select a spot size of the output electromagnetic radiation.

13. The illumination system of claim 1, wherein an arrangement of the plurality of illumination sources comprises a circular shape and two opposing quadrants.

14. The illumination system of claim 1, wherein an arrangement of the plurality of illumination sources comprises a minimum pitch size of approximately 20 μm.

15. The illumination system of claim 1, wherein the different photoluminescent materials comprise different narrowband emitting phosphors, and wherein the different narrowband emitting phosphors are configured to emit narrowband electromagnetic radiation comprising different center wavelengths that span a visible spectrum.

16. An illumination system comprising:
a microLED array;
at least two different phosphors arranged to be illuminated by the microLED array and to thereby emit output light, wherein the different phosphors have different emission spectral properties of the output light and wherein the illumination of the different phosphors by the microLED array is selectable by selective activation of the microLED array and/or movement of the different phosphors relative to the microLED array to provide different illumination of the different phosphors, so as to provide tunable spectral properties of the output light; and
one or more filter wheels configured to filter the output light in accordance with the selected illumination of the different phosphors.

17. An inspection apparatus comprising:
a plurality of illumination sources;
at least two different photoluminescent materials arranged to be illuminated by the plurality of illumination sources and to thereby emit output electromagnetic radiation, wherein the different photoluminescent materials have different emission spectral properties of the output electromagnetic radiation, and wherein the illumination of the different photoluminescent materials is selectable by selective activation of the illumination sources to provide different illumination of the different photoluminescent materials, so as to provide tunable spectral properties of the output electromagnetic radiation; and
a plurality of selectively configurable filters arranged to filter the output electromagnetic radiation in accordance with the selected illumination of the different photoluminescent materials.

18. A lithographic apparatus comprising:
a plurality of illumination sources;
at least two different photoluminescent materials arranged to be illuminated by the plurality of illumination sources and to thereby emit output electromagnetic radiation, wherein the different photoluminescent materials have different emission spectral properties of the output electromagnetic radiation, and wherein the illumination of the different photoluminescent materials is selectable by selective activation of the illumination sources to provide different illumination of the different photoluminescent materials, so as to provide tunable spectral properties of the output electromagnetic radiation; and
a plurality of selectively configurable filters arranged to filter the output electromagnetic radiation in accordance with the selected illumination of the different photoluminescent materials.

19. An inspection apparatus comprising:
a microLED array;
at least two different phosphors arranged to be illuminated by the microLED array and to thereby emit output light, wherein the different phosphors have different emission spectral properties of the output light and wherein the illumination of the different phosphors by the microLED array is selectable by selective activation of the microLED array and/or movement of the different phosphors relative to the microLED array to provide different illumination of the different phosphors, so as to provide tunable spectral properties of the output light; and
one or more filter wheels configured to filter the output light in accordance with the selected illumination of the different phosphors.

20. A lithographic apparatus comprising:
a microLED array;
at least two different phosphors arranged to be illuminated by the microLED array and to thereby emit output light, wherein the different phosphors have different emission spectral properties of the output light and wherein the illumination of the different phosphors by the microLED array is selectable by selective activation of the microLED array and/or movement of the different phosphors relative to the microLED array to provide different illumination of the different phosphors, so as to provide tunable spectral properties of the output light; and
one or more filter wheels configured to filter the output light in accordance with the selected illumination of the different phosphors.

* * * * *